United States Patent [19]

Kazuhito et al.

[11] Patent Number: 5,006,884
[45] Date of Patent: Apr. 9, 1991

[54] IMAGING DEVICE

[75] Inventors: Ishida Kazuhito, Nagoya; Shibata Eiji, Ibi; Makino Kazumasa, Tsushima, all of Japan

[73] Assignee: Brother Kogyo Kabushiki Kaisha, Nagoya, Japan

[21] Appl. No.: 360,601

[22] Filed: Jun. 2, 1989

[30] Foreign Application Priority Data

Jun. 3, 1988 [JP] Japan .................................. 63-138073

[51] Int. Cl.$^5$ ............................................ G03B 27/62
[52] U.S. Cl. .......................................... 355/27; 355/72
[58] Field of Search ...................... 355/27, 28, 72, 75, 355/76, 133; 430/138

[56] References Cited

U.S. PATENT DOCUMENTS 4,825,257  4/1989  Yoshino et al. .................... 355/132
4,875,075  10/1989 Sootome et al. ................ 355/75 X Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

An imaging device of the type which utilizes a horizontally movable tray for placing an original thereon and a cartridge of a continuous-form recording sheet is provided with a housing into which the cartridge is accommodated. The housing has a cover connected to a mechanism which locks the original tray at a predetermined position when the housing cover is opened.

5 Claims, 4 Drawing Sheets

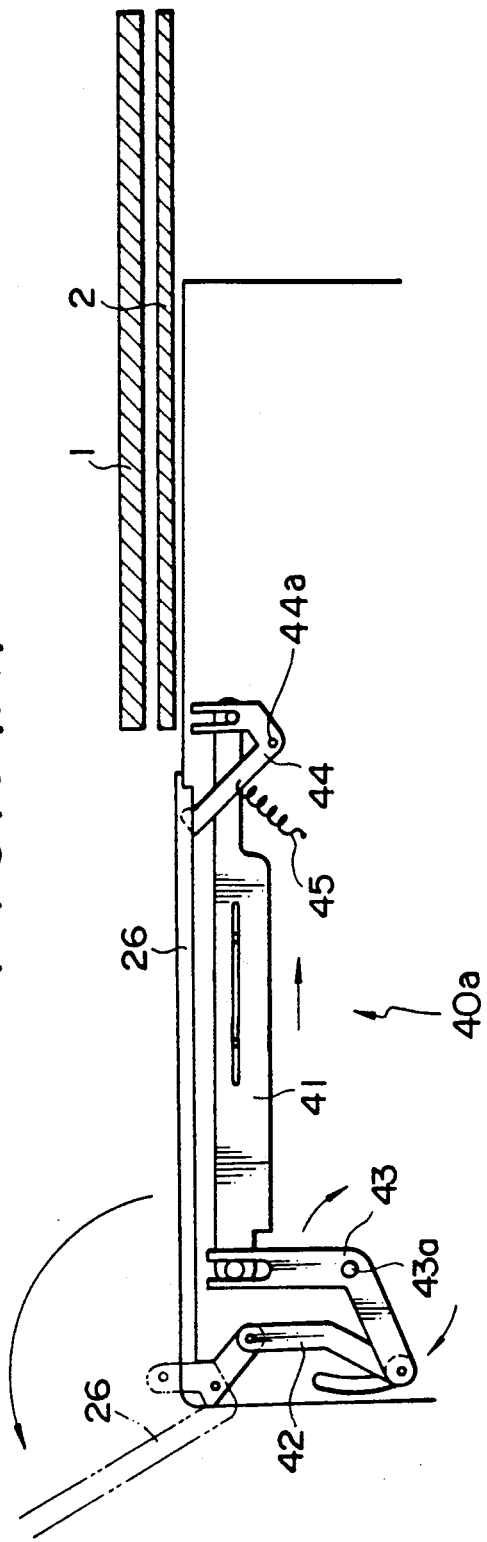
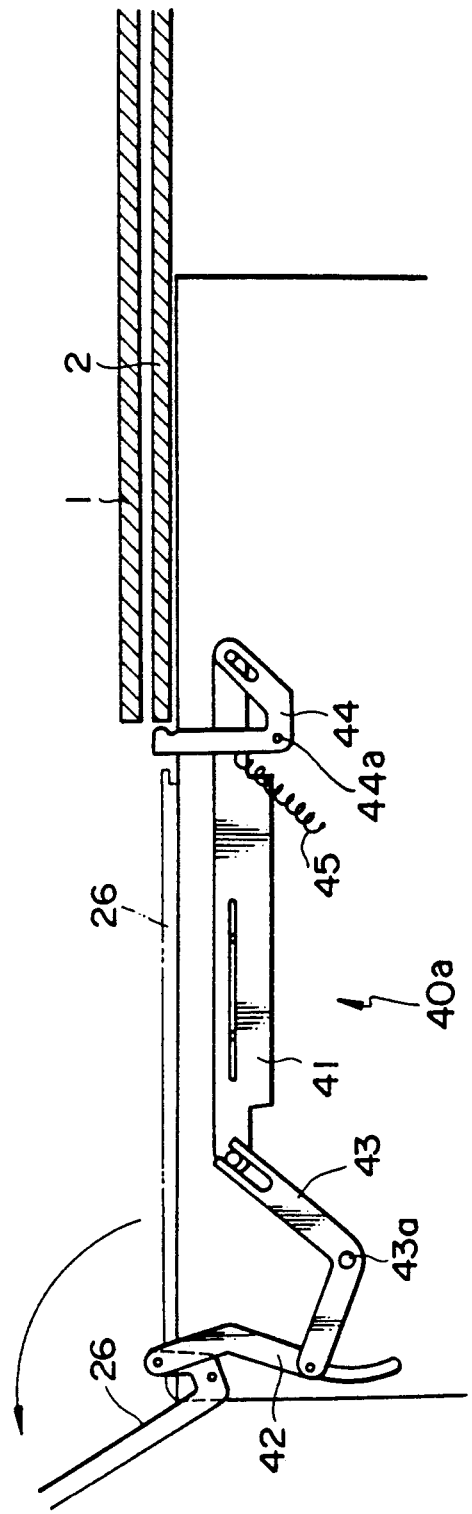

IMAGING DEVICE

BACKGROUND OF THE INVENTION

This invention relates to an imaging device, more particularly, to an imaging device employing a continuous-form recording sheet and having a function capable of locking an original tray of the imaging device when a cover of a housing container a cartridge of the recording sheet is opened.

In a conventional imaging device employing a continuous-form recording sheet, a film serving as the continous-form recording sheet in the form of a roll is accommodated in a cartridge and the cartridge containing such a film is housed in the device for copying purposes. On the other hand, an inner cover is used to screen the cartridge in the device from outside light. In case the user has used up a whole roll of recording medium, it will be necessary to follow the following steps of procedure comprising replacing the cartridge with a new one by opening the inner cover, rearranging a new recording sheet in each mechanism of the device, housing the cartridge body in the device and closing the inner cover. In this case, an original tray being horizontally movable has to be moved opposite to the inner cover side, i.e., to the rightmost end thereof in the present embodiment, so as not to obstruct the operation of opening and closing the inner cover. The cartridge is thus replaced.

While the inner cover is held open, the cartridge is replaced or the recording sheet is passed through the various mechanisms of the above-described device. If the original tray is allowed to move toward the inner cover (leftward in this embodiment) due to inadvertence of the operator or an unexpected impact, the aforesaid operations may be impeded and besides the operator will have to return the original tray to the initial position each time such a happening occurs. Provided the movement of the original tray toward the inner cover is great, moreover, a collision between the inner cover thus opened and the leftside of the original tray tends to become unavoidable, thus causing damage to the inner cover or original tray.

The further drawback is that, since the recording medium is, as shown in FIG. 1, fed to the device after the cartridge body is mounted on the original tray cover 1 and stablized thereon, the operation of passing paper therethrough becomes laborious. In addition, the recording sheet may become jammed in the gap between the original tray and the device and, in the worst case, ruptured therein.

SUMMARY OF THE INVENTION

It is therefore an object of the invention to provide an improved imaging device with capable of locking the orignal tray at a predetermined position when the cover of a housing containing the recording sheet is opened.

For this purpose according to the invention, there is provided an imaging device employing a continuous-form recording sheet, said imaging device further comprises:
  a tray member horizontally movable for placing an original thereon, said recording sheet being exposed in accordance with an image of the orginal placed on said tray member;
  a housing member being provided below said tray member and having a cover openable in case said tray member being located at a predetermined position for accommodating a cartridge containing said recording sheet; and
  control means for controlling said tray member so as to be locked at said predetermined position in case that said cover is opened.

DESCRIPTION OF THE ACCOMPANYING DRAWINGS

Figure 4:
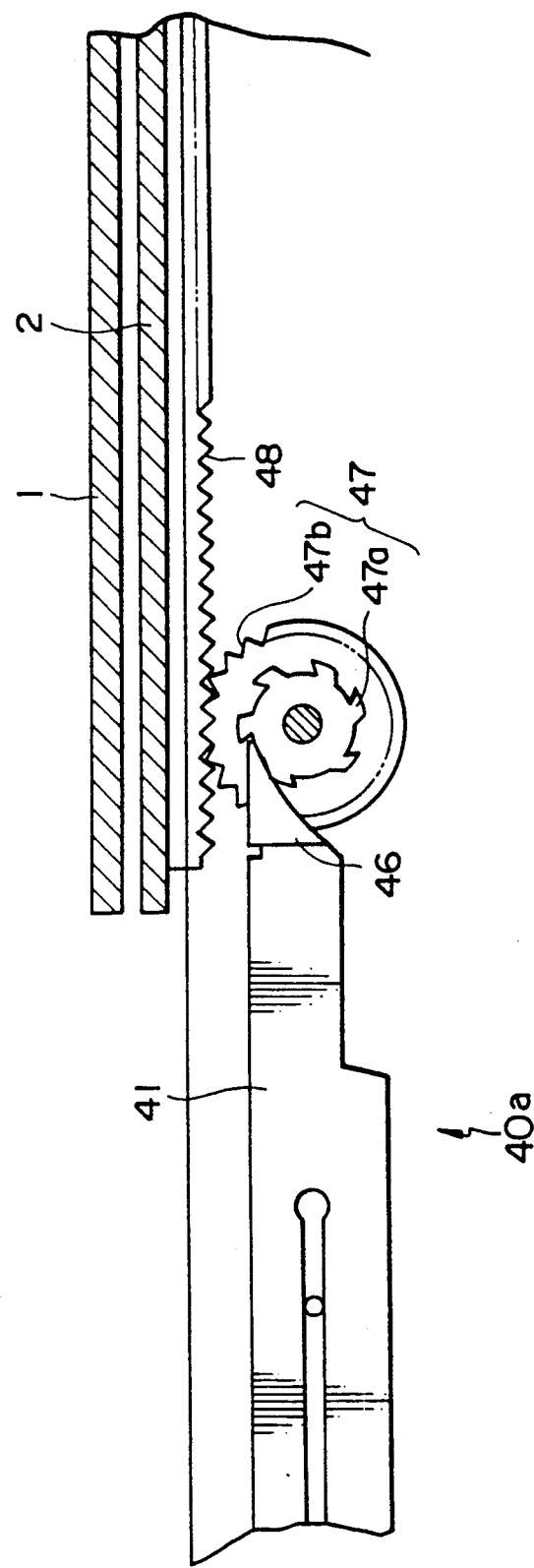

FIGS. 3(A) (B) are illustrative views of the principal part of an imaging device embodying the invention; and FIG. 4 is an another illustrative view of the principal part of an imaging device embodying the invention.

DESCRIPTION OF THE EMBODIMENTS

Referring to the accompany drawings, a specific embodiment of the present invention will subsequently be described.

Figure 1:
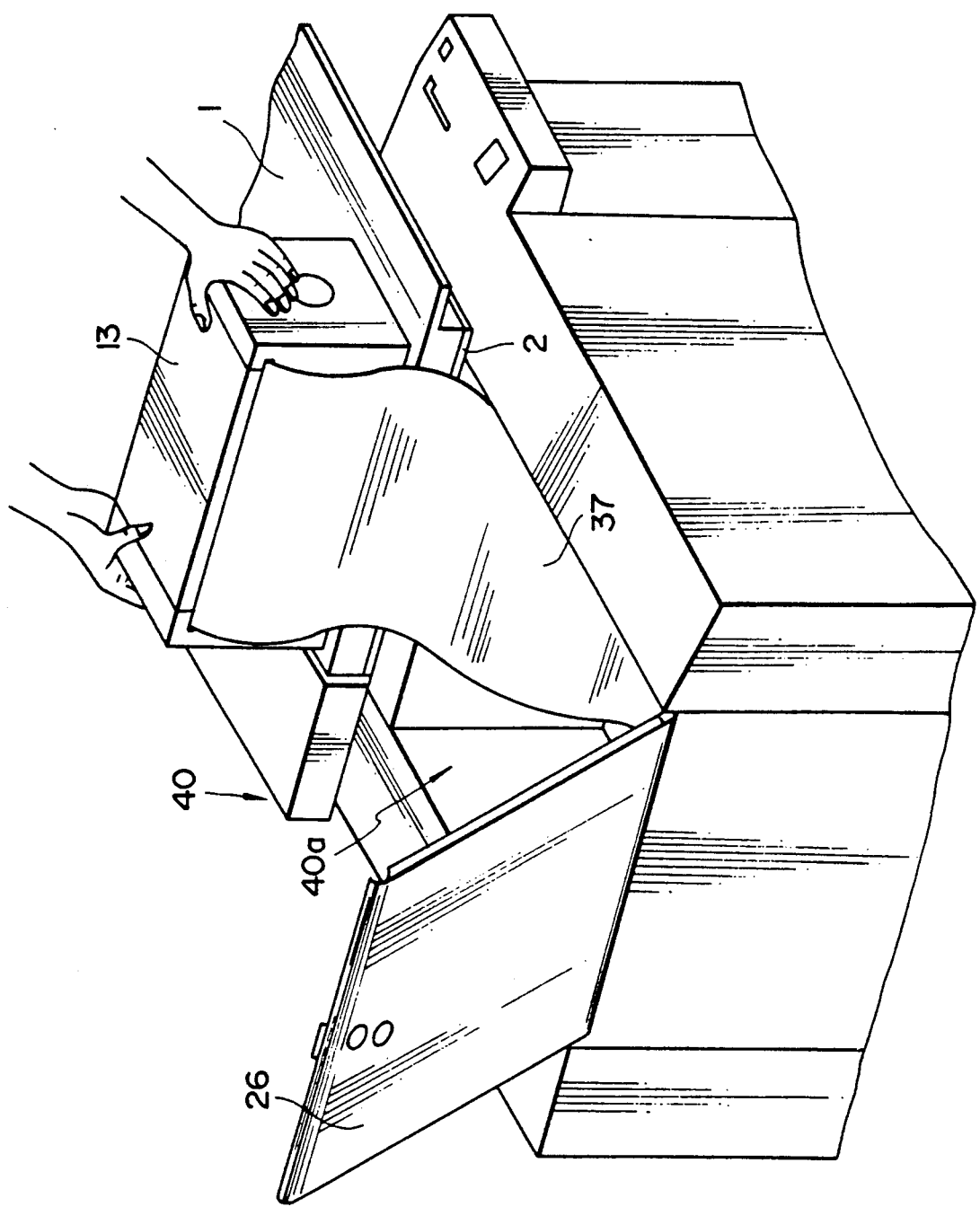
FIG. 1 is an operational diagram for illustrating an operation of a conventional imaging device.
Figure 2:
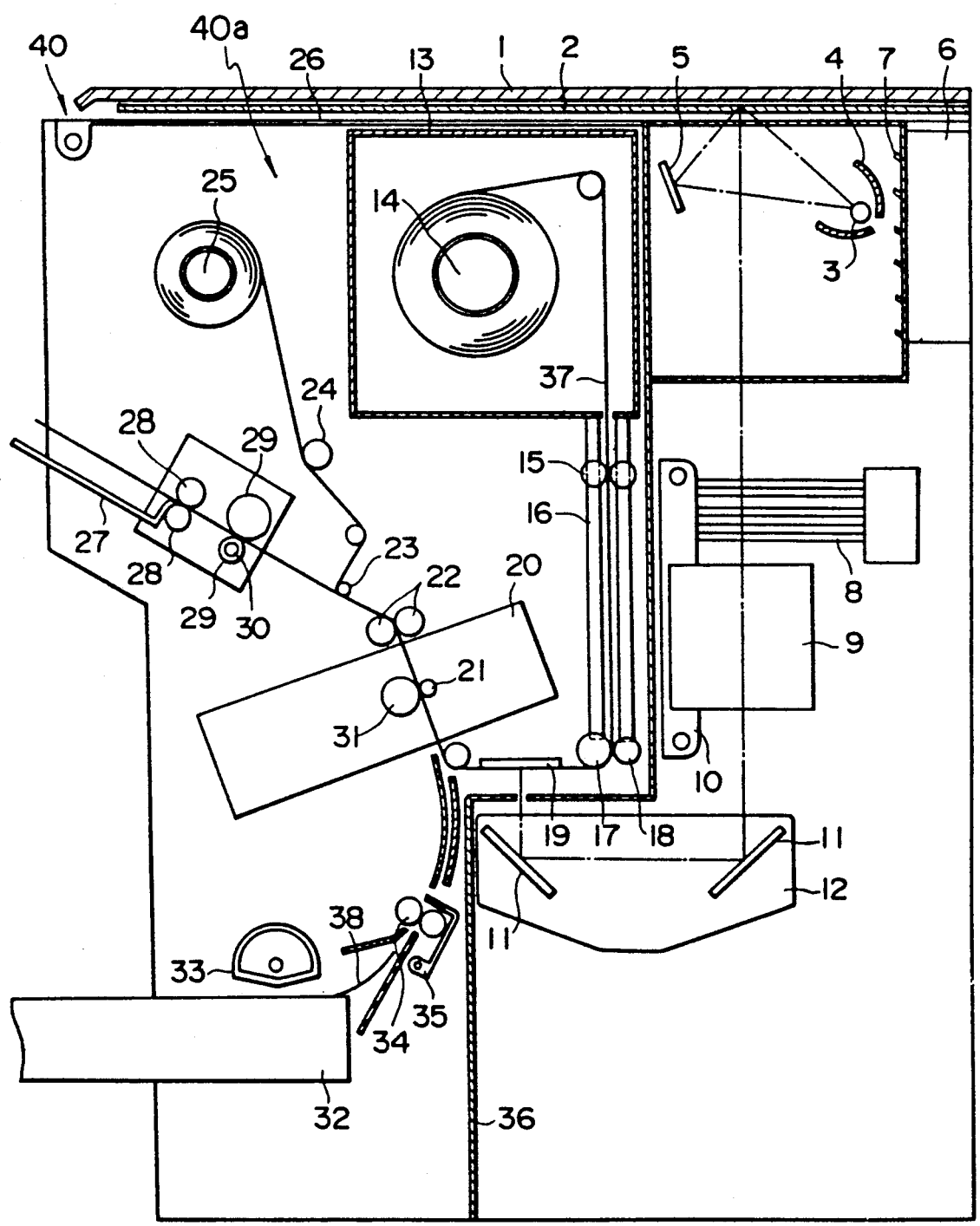
FIG. 2 is a sectional view of an imaging device according to the invention.

FIG. 2 is a schematic sectional view of a photo and pressure sensitive copying machine capable of taking full color copies. Incidentally, a detailed description will be omitted of sensitized paper (comprising microcapsule sheet and developing sheet) of the sort which makes such full color copies taken because such sensitized paper has already been proposed in Japanese Patent Provisional Publication SHO58-88739, etc.

As shown in FIG. 2, the photo and pressure sensitive copying machine 40 includes a glass tray 2 and a tray cover 1, both of which are reciprocally movable rightward and leftward, and a desired original may be placed upside down on the glass tray 2. Secured to the upper right portion of the machine 40 is a light source formed with a halogen lamp 3 extending in the direction perpendicular to which the glass tray 2 moves and a semicylindrical reflection mirror 4 disposed so as to surround the lamp 3. The light is thus linearly sent upon the glass tray 2.

As the glass tray 2 reciprocates, the whole surface of the glass tray 2 ranging from its leftmost to rightmost end can be irradiated sucessively with the light emitted from the halogen lamp 3. The light emitted from the light source passes through the transparent glass tray 2 and is reflected from the original placed thereon. Further, the surface of the glass tray 2 is covered with the tray cover 1 to prevent the light thus applied from leaking along the original.

In order to utilize the light emitted from the halogen lamp 3 efficiently for irradiating the original, a reflector 5 is arranged to the left of the light source so that the light not directly sent to the original is reflected therefrom and used to irradiate the original again.

A fan 6 and a louver 7 are provided to the right of the halogen lamp to intake air from the outside, whereby the air is efficiently applied to the glass tray 2. The light emitted from the halogen lamp 3 and reflected from the original located on the glass tray 2 is introduced via a filter 8 to a lens 9. The filter 8 is designed to alter light transmission characteristics in accordance with the sensitivity characteristics of microcapusule sheet 37 and to adjust tonality of the duplicated image. The lens 9 is mounted on a lens mount plate 10 in such a manner that fine angle adjustment is made possible with repect to the optical path thereof.

The light condensed by the lens 9 is turned at an angle of 180 degrees by a pair of reflection mirrors 11 and focused on the microcapsule sheet 37 set in intimate contact with the undersurface of an exposure tray 19. The two reflection mirrors 11 are secured to a mirror mount plate 12.

The continuous-form microcapsule sheet 37 wound onto a detachable cartridge shaft 14 is housed in a cartridge 13 disposed in a housing 40a located under the glas tray 2, one end of the sheet of the paper reaching a take-up shaft 25 via a multiple of rollers and a pressure developing unit 20.

More specifically, the microcapsule sheet 37 led out from the underside of the cartridge 13 is guided along the undersurface of the exposure tray 19 via feed rollers 15 and guide rollers 17, 18 and further fed to the pressure developing unit 20. The microcapsule sheet 37 passed through the pressure developing unit 20 is then guided by a peel roller 23 and a winding run adjustment roller 24 before being wound onto the take-up shaft 25. The unexposed microcapsule sheet 37 leaving the cartridge 13 is held unexpposed by means of a shield cover 16.

The microcapsule sheet 37 is controlled by paper feed rollers 22 to travel at a constant speed in synchronism with the moving speed of the glass tray 2. Consequently, a latent image of a predetermined line is successively formed on the original while it is passed through the exposure tray 19.

Moreover, a developing sheet cassette 32 for accommodating cut-sheet type developing sheet 38 is installed under the pressure developing unit 20. The developing sheet 38 is taken out one sheet after another by a semi-cylindrical roller 33 and carried to be brought into the pressure developing unit 20 after the front end of each sheet is subjected to positioning by means of developing sheet rollers 34 and a resist gate 35.

As a result, the microcapsule sheet 37 and the developing sheet 38 are fed to the pressure developing unit 20 in an integrally superposed state. The pressure developing unit 20 comprises a small-diameter roller 21 and a backup roller 31. While the microcapsule side, on which the latent image is formed, of the microcapsule sheet 37 and the developer-coated side of the developing sheet 38 contact face-to-face on the inside, both the integrally combined sheets of paper are pinched and pressed together in between the small-diameter roller 21 and the backup roller 31. With the pressure thus applied, the unexposed microcapsule are crushed to form an image on the developing sheet 38.

The microcapsule sheet 37 and the developing sheet 38 led out of the pressure developing unit are carried by the paper feed rollers 22 and then separated from each other in such a manner that the former moves up while the latter moves straight. A heat fixing unit promotes color development in order to form an image on the developing sheet 38, which is discharged into a paper discharge tray 27, with the image-carrying side up. The heat fixing unit comprises a hollow heat roller 29 having a heater 30 therein and developing paper feed rollers 28.

The microcapsule sheet 37 thus separated is wound onto the take-up shaft 25 via the winding run adjustment roller 24.

The operation of the copying machine 40 thus constructed will subsequently be described.

When a start button (not shown) is pressed down after an original is placed on the glass tray 2, with the tray cover 1 opened, the glass tray 2 is moved rightward in FIG. 2 and brought to stop position where the leftmost end thereof is located opposite to the light source. The glass tray 2 is moved leftward while the halogen lamp 3 is held on. The light derived from the halogen lamp 3 is reflected from the original and then passed through the filter 8 and the lens 9 before being reflected from the two reflection mirrors 11 to from a latent image on the microcapsule sheet 37 placed under the exposure tray 19. Since the microcapsule sheet 37 moves leftward along the exposure tray 19 at the same speed as that of travel of the glass tray 2 at that time, the latent image corresponding to the image on the original is formed on the microcapsule sheet 37.

With the leftward movement of the glass tray 2, the developing sheet 38 is taken out by the semi-cylindrical roller 33 from the developing sheet cassette 32 and superposed on the exposed microcapsule sheet 37, the combination of these sheets of paper being fed to the pressure developing unit 20. The latent image on the microcapsule sheet 37 is then developed and transferred onto the developing sheet 38.

The developing sheet 38 is subjected to heat fixation by the heat fixing unit and discharged from the copying machine 40. The microcapsule sheet 37 passed through the pressure developing unit 20 is successively taken onto the take-up shaft 25. When the glass tray 2 has moved up to the position where its rightmost end is located opposite to the light source, the operation of taking the copy of the orignal is completed and the halogen lamp 3 is turned off.

Referring to FIG. 3(A) and FIG. 3(B), the principal part of the imaging device embodying the present invention will subsequently be described. One end of a side plate crank 42 is pivotally fitted to the end of an inner cover 26 for screening a housing 40a from the outside, the other end thereof being pivotally fitted to one end of a bell crank 43 whose center portion pivots on a pin 43a. A restraint member 44, whose center part is supported with a pin 44a to rotate on a pivot, has one end mating with the glass tray 2 to stop the movement of the glass tray 2, the other end being coupled via a cam plate 41 to the other end of the bell crank 43.

In operation, the side plate crank 42 rotatably coupled to the inner cover 26 is lifted when the inner cover 26 is opened; whereby the bell crank 43 is rotated clockwise round the pin 43a, whereas the cam plate 41 slides rightward. Further, the restraint member 44 rotates clockwise on a pin 44a. Consequently, the original tray 2 is prevented from moving leftward with respect to the glass. The restraint member 44 is equipped with a spring 45, which is so biased as to make the restraint member 44 perform resetting operation when the inner cover 26 is closed.

FIG. 4 shows another embodiment of the present invention, wherein although the whole mechanism is operated in the same manner as mentioned above up to the operation of the cam palte 41, a ratchet wheel 47a is further provided coaxially with a pinion gear on the pinion side 47b of a pinion 47 with a rack 48, these together forming a power transmission means for driving the glass tray 2. A ratchet 46 meshing with the ratchet wheel is fitted to the front end of the cam plate 41. With this arrangement, the glass tray 2 is prevented from moving leftward in FIG. 4.

What is claimed is:

1. An imaging device employing a recording medium, said imaging device further comprises:

a tray member horizontally movable for placing an original thereon, said recording medium being exposed in accordance with an image of the original placed on said tray member:

a housing member for accomodating a cartridge containing said recording medium provided below said tray member said housing member having a cover openable when said tray member is located at a predetermined position; and control means for controlling said tray member to be locked at said predetermined position when said housing member cover is opened, said control means comprises a crank member vertically displaceable in accordance with an operation of said cover and a locking member for locking said tray member at said predetermined position in accordance with an operation of said crank member.

2. The imaging device according to claim 1 wherein said recording medium is coated with a plurality of photo and pressure sensitive microcapsules, said recording medium being pressurized with a developing sheet coated with a developer material to develop a visible image.

3. The imaging device according to claim 1 wherein said locking member comprises a restraint member adapted to be brought into and out of contact with a predetermined portion of said tray member in accordance with an operation of said crank member.

4. The imaging device according to claim 1 wherein said locking member comprises a pinion member with a rack position provided under said tray member and a ratchet member adapted to be brought into engagement with a ratchet wheel provided on said pinion member in case that said cover is opened.

5. The invention in accordance with claim 2 wherein said recording medium comprises a continuous form recording sheet.

* * * * *